United States Patent
Lee et al.

(10) Patent No.: US 9,502,121 B2
(45) Date of Patent: *Nov. 22, 2016

(54) METHOD AND APPARATUS FOR REDUCING ERASE TIME OF MEMORY BY USING PARTIAL PRE-PROGRAMMING

(71) Applicant: Macronix International Co., Ltd., Hsinchu (TW)

(72) Inventors: Chun-Yi Lee, Hsinchu (TW); Kuen-Long Chang, Taipei (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,645

(22) Filed: Oct. 20, 2014

(65) Prior Publication Data

US 2015/0036436 A1 Feb. 5, 2015

Related U.S. Application Data

(63) Continuation of application No. 13/453,312, filed on Apr. 23, 2012, now Pat. No. 8,891,312.

(51) Int. Cl.
*G11C 16/14* (2006.01)
*G11C 16/16* (2006.01)
*G11C 16/34* (2006.01)

(52) U.S. Cl.
CPC .............. *G11C 16/14* (2013.01); *G11C 16/16* (2013.01); *G11C 16/344* (2013.01)

(58) Field of Classification Search
None
See application file for complete search history.

(56) References Cited

U.S. PATENT DOCUMENTS

| | | | |
|---|---|---|---|
| 6,094,373 A | 7/2000 | Saito | |
| 6,842,378 B2 | 1/2005 | Chang | |
| 7,701,741 B2 | 4/2010 | Yip | |
| 8,891,312 B2 | 11/2014 | Lee et al. | |
| 8,982,640 B2 | 3/2015 | Hung et al. | |
| 2003/0214852 A1* | 11/2003 | Chang | G11C 16/28 365/200 |
| 2008/0123436 A1* | 5/2008 | Byeon | G11C 11/5635 365/185.29 |
| 2008/0285368 A1 | 11/2008 | Hung et al. | |
| 2012/0008396 A1 | 1/2012 | Park | |
| 2014/0063947 A1 | 3/2014 | Ghodsi | |

* cited by examiner

*Primary Examiner* — James G Norman
(74) *Attorney, Agent, or Firm* — Haynes Beffel & Wolfeld LLP

(57) ABSTRACT

Memory cells of a nonvolatile memory array are characterized by one of multiple threshold voltage ranges including at least an erased threshold voltage range and a programmed threshold voltage range. Responsive to an erase command to erase a group of memory cells of the nonvolatile memory array, a plurality of phases are performed, including at least a pre-program phase and an erase phase. The pre-program phase programs a first set of memory cells in the group having threshold voltages within the erased threshold voltage range, and does not program a second set of memory cells in the group having threshold voltages within the erased threshold voltage range in the group. By not programming the second set of memory cells, the pre-program phase is performed more quickly than if the second set of memory cells were programmed along with the first set of memory cells.

16 Claims, 8 Drawing Sheets

METHOD AND APPARATUS FOR REDUCING ERASE TIME OF MEMORY BY USING PARTIAL PRE-PROGRAMMING

PRIORITY APPLICATIONS

This application is a continuation of U.S. patent application Ser. No. 13/453,312, filed 23 Apr. 2012 (now U.S. Pat. No. 8,891,312) entitled Method and Apparatus for Reducing Erase Time of Memory By Using Partial Pre-Programming. This application is incorporated herein by reference.

BACKGROUND

Description of Related Art

U.S. Pat. Nos. 6,094,373 and 6,842,378 discuss an erase procedure of a group of memory cells, in which the actual erase step follows a pre-program step. In the group of memory cells, some memory cells may be in the programmed state, and other memory cells may be in the erased state. Prior to erasing all of the memory cells in the group of memory cells, the memory cells in the group that are already in the erased state are pre-programmed to a programmed state. Such pre-programming brings all of the memory cells in the group of memory cells to a shared programmed state, and prevents memory cells in the erased state from being erased again. The erase which follows pre-program then brings all of the memory cells in the group of memory cells from the programmed state to a shared erased state. Accordingly, pre-program prevents an undesirably wide distribution of threshold voltages in the group of memory cells following the erase, by bringing the threshold voltages of all memory cells in the group to the programmed state prior to the erase.

A disadvantage with pre-program is its time consuming nature, compared to erase. Erase is relatively quick compared to pre-program, and all memory cells in the group are erased. However, not all memory cells in the group are pre-programmed; memory cells in the erased state and memory cells in the programmed state are treated differently. Memory cells in the group that are in the erased state are pre-programmed to a programmed state, and memory cells in the group that are in the programmed state are not pre-programmed. This difference in treatment of memory cells in different states results in pre-program taking significantly longer than erase. Although pre-program results in a narrowed distribution of threshold voltages for the group of memory cells, pre-program also results in a lengthy erase procedure.

SUMMARY

The technology described here includes an integrated circuit with a nonvolatile memory array and control circuitry. Memory cells of the nonvolatile memory array are characterized by one of multiple threshold voltage ranges including at least an erased threshold voltage range and a programmed threshold voltage range. The control circuitry is responsive to an erase command to erase a group of memory cells of the nonvolatile memory array, with a plurality of phases including at least a pre-program phase and an erase phase. In the pre-program phase, the control circuitry programs a first set of memory cells in the group having threshold voltages within the erased threshold voltage range, and does not program a second set of memory cells in the group having threshold voltages within the erased threshold voltage range in the group. By not programming the second set of memory cells, the pre-program phase is performed more quickly than if the second set of memory cells were programmed along with the first set of memory cells. In the erase phase after the pre-program phase, the control circuitry erases the group.

In some embodiments of the described technology, the erase command selects the group of memory cells to erase from a plurality of erase groups dividing the nonvolatile memory array.

In some embodiments of the described technology, the group of memory cells specified in the erase command, is divided into a plurality of pre-program regions. The first set of memory cells programmed in the pre-program phase, is limited to a pre-program region of the plurality of pre-program regions. Memory cells in other pre-program regions are not programmed, regardless of whether the memory cells have threshold voltages within the erased threshold voltage range. The pre-program region can be determined by pre-program location data stored in a memory. The pre-program region can also be selected from the plurality of pre-program regions. The pre-program region can also be changed to a next pre-program region of the pre-program regions each time the control circuitry is responsive to the erase command to erase the group. In some embodiments of the described technology, the pre-program region is selected a first time the control circuitry is responsive to the erase command to erase the group after the integrated circuit is turned on, and in second and later times the control circuitry is responsive to the erase command to erase the group after the integrated circuit is turned on, the pre-program region is changed to a next pre-program region.

In some embodiments of the described technology, the erase phase erases at least the first set of memory cells (programmed in the pre-program phase) and the second set of memory cells (not programmed in the pre-program phase). The first set of memory cells (programmed in the pre-program phase) and the second set of memory cells (not programmed in the pre-program phase) have threshold voltages within the erased threshold voltage range prior to the pre-program phase. The group of memory cells selected for erase by the erase command, can further include a third set of memory cells having threshold voltages within the programmed threshold voltage range prior to the pre-program phase. The third set of memory cells is not programmed during the pre-program phase, and is erased during the erase phase along with the first set of memory cells and the second set of memory cells.

Additional technology described here includes a method. The method comprises at least the following step: responsive to an erase command to erase a group of memory cells of a nonvolatile memory array, the data in the memory cells characterized by one of a plurality of threshold voltage ranges including at least an erased threshold voltage range and a programmed threshold voltage range:

(i) performing a pre-program phase that programs a first set of memory cells in the group having threshold voltages within the erased threshold voltage range, and that does not program a second set of memory cells in the group having threshold voltages within the erased threshold voltage range in the group, and (ii) performing an erase phase after the pre-program phase, the erase phase erasing the group.

Other embodiments of the described technology are disclosed herein.

In another aspect of the described technology, during the pre-program phase, the control circuitry programs a first set of memory cells having threshold voltages within the erased threshold voltage range in only a pre-program region of a plurality of pre-program regions dividing the group, regardless of whether other memory cells have threshold voltages within the erased threshold voltage range in other pre-program regions of the plurality of pre-program regions dividing the group.

Further technology described here includes an integrated circuit with a nonvolatile memory array and control circuitry. The nonvolatile memory array has memory cells each having a threshold voltage in one of an erased state and a programmed state. The control circuitry erases a group of memory cells of the nonvolatile memory array in an erase cycle. The erase cycle includes at least: (i) a pre-program phase that programs only part of the memory cells in the erased state, and (ii) an erase phase after the pre-program phase, the erase phase erasing the group.

Further technology described here includes a method of erasing memory cells in an erase cycle, the memory cells arranged in a memory array having a plurality of word lines. The method of the erase cycle comprises at least the following:

performing in the erase cycle, a pre-program phase that program only part of a set of memory cells each in an erase state; and performing in the erase cycle, an erase phase after the pre-program phase, the erase phase erasing all of the set of memory cells.

In some embodiments of the described technology, the set of memory cells is allocated a plurality of word lines, and the part of the set of memory cells is allocated a part of the plurality of word lines.

In some embodiments of the described technology, the method is responsive to an erase command to erase a group of the memory cells of the memory array, and data in the memory cells are characterized by one of a plurality of threshold voltage ranges including at least an erased threshold voltage range of the erased state and a programmed threshold voltage range of a programmed state.

In some embodiments of the described technology, the part of the set of memory cells programmed in the pre-program phase is limited to a pre-program region of a plurality of pre-program regions dividing the group. Some embodiments of the described technology further comprise, reading pre-program location data stored in a memory to determine the pre-program region. Some embodiments of the described technology further comprise, selecting the pre-program region from the plurality of pre-program regions. Some embodiments of the described technology further comprise, a first time the erase command is received after an integrated circuit with the nonvolatile memory array is turned on, selecting the pre-program region from the plurality of pre-program regions. Some embodiments of the described technology further comprise, each time the erase command is received, changing the pre-program region to a next pre-program region. Some embodiments of the described technology further comprise, a first time the erase command is received after an integrated circuit with the nonvolatile memory array is turned on, selecting the pre-program region from the plurality of pre-program regions, and a second and later times the erase command is received after the integrated circuit with the nonvolatile memory array is turned on, changing the pre-program region to a next pre-program region.

In some embodiments of the described technology, the pre-program phase does not program a second set of memory cells in the group having threshold voltages within the programmed threshold voltage range in the group, and the erase phase erases the part of the set of memory cells, other memory cells in the set of memory cells that are not in the part of set of memory cells, and the second set of memory cells.

Other embodiments of the described technology are disclosed herein.

DETAILED DESCRIPTION

Figure 1:
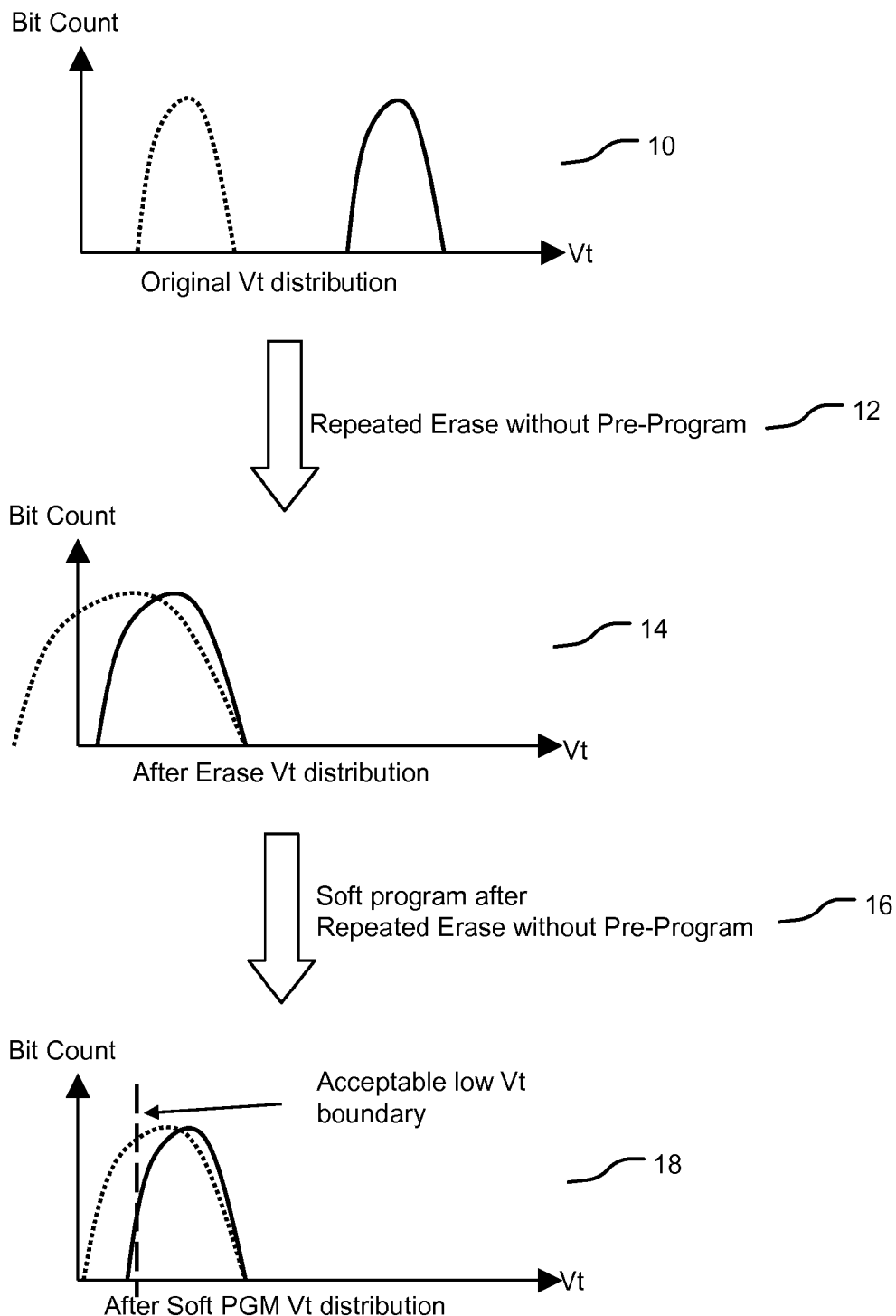
FIG. 1 is an example flowchart of an erase procedure showing a series of threshold voltage distributions of memory cells during an erase procedure featuring repeated erase without pre-program.

FIG. 1 is an example flowchart of an erase procedure showing a series of threshold voltage distributions of memory cells during an erase procedure featuring repeated erase procedures without pre-program.

In the series of graphs showing the threshold voltage distribution of a group of memory cells, two threshold voltage distributions are shown. The dotted line shows the threshold voltage distribution of memory cells in the group which begin the erase procedure in the erased state, with threshold voltages within a low erased threshold voltage range The solid line shows the threshold voltage distribution of memory cells in the group which begin the erase procedure in the programmed state, with threshold voltages within a high programmed threshold voltage range.

At 10, two distinct threshold voltage distributions are shown. The memory cells represented by the two distinct threshold voltage distributions can represent, in combination, the threshold voltage distribution of memory cells in an erase group. The dotted line threshold voltage distribution represents memory cells in the group which begin the erase procedure with a low threshold voltage erased state. The solid line threshold voltage distribution represents memory cells in the group which begin the erase procedure with a high threshold voltage programmed state.

At 12, the group of memory cells undergoes the erase step repeatedly without pre-program. The erase step is repeated in the sense that multiple erase procedures without pre-program are the cause of an undesirably wide threshold voltage distribution, as discussed in the following. Any single particular erase procedure can have a single erase step (or multiple erase steps if erase verify fails).

At 14, two overlapping threshold voltage distributions are shown. Again, the memory cells represented by the two overlapping threshold voltage distributions can represent, in combination, the threshold voltage distribution of memory cells in an erase group. The dotted line threshold voltage distribution represents memory cells in the group which began the erase procedure with a low threshold voltage erased state, but now has an undesirably wide threshold voltage distribution, spreading even into negative threshold voltages. The dotted line threshold voltage distribution has been erased repeatedly, despite beginning with a low threshold voltage erased state already. Because the pre-program step has been skipped repeatedly over multiple erase procedures, the threshold voltage distribution has been stretched in the negative threshold voltage direction. The solid line threshold voltage distribution represents memory cells in the group which began the erase procedure with a high threshold voltage programmed state.

At 16, the group of memory cells undergoes soft program. The effect of soft program on the over-erased and low threshold voltages cells, is to tighten threshold voltage distribution of the group of memory cells.

At 18, two overlapping threshold voltage distributions are shown. Soft program only partly successful in correcting the undesirably wide threshold voltage distribution. The solid line threshold voltage distribution represents memory cells in the group which began the erase procedure with a high threshold voltage programmed state. Soft program is sufficient to correct this solid line threshold voltage distribution. The dotted line threshold voltage distribution represents memory cells in the group which began the erase procedure with a low threshold voltage erased state, but now has an undesirably wide threshold voltage distribution, spreading even into negative threshold voltages. Soft program is insufficient to correct this dotted line threshold voltage distribution.

The erase procedure of as shown in 10-18 is relatively quick, due to skipping the pre-program step. However, the resulting threshold voltage distribution is wide, even stretching into negative threshold voltages, which is problematic for a NOR array.

Figure 2:
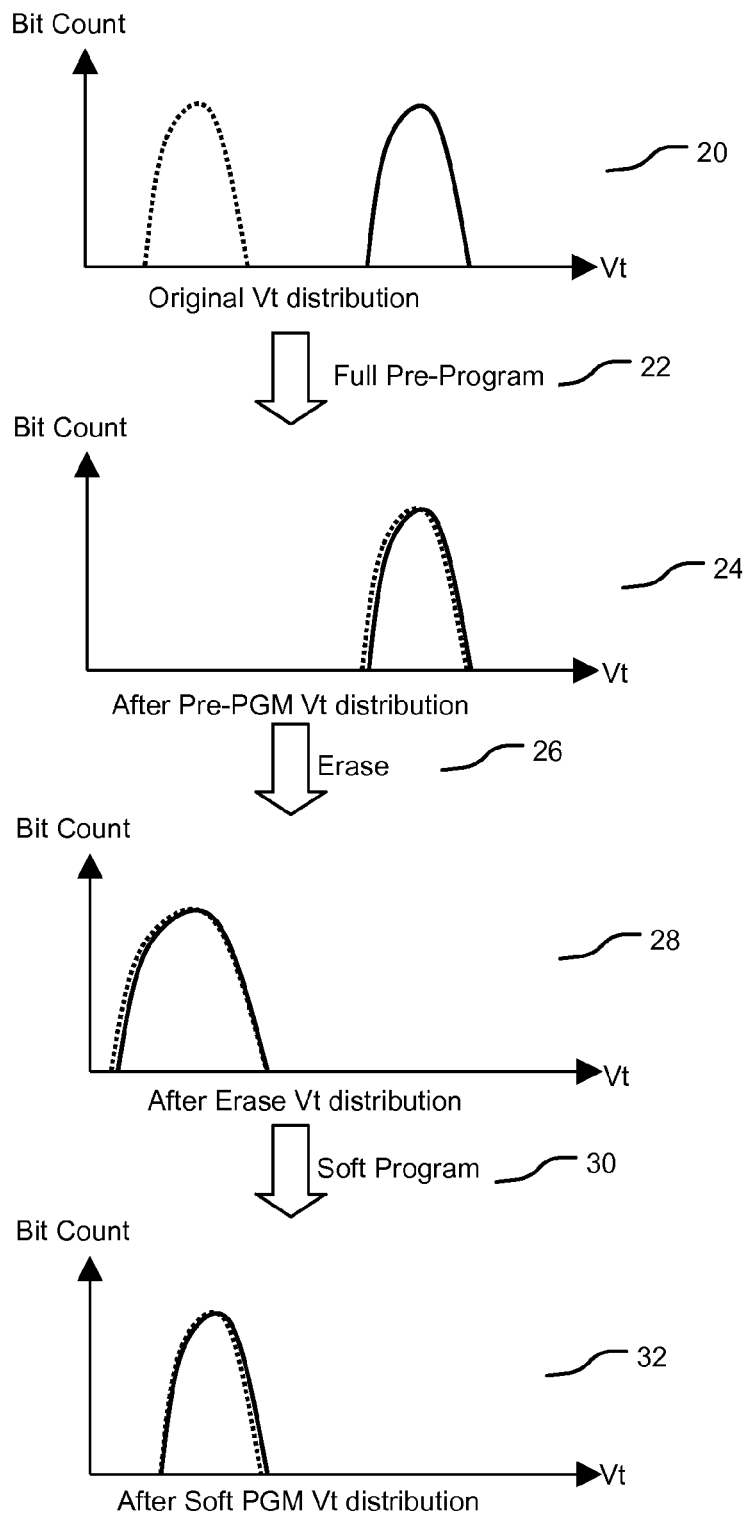
FIG. 2 is an example flowchart of an erase procedure showing a series of threshold voltage distributions of memory cells during an erase procedure featuring complete pre-program.

FIG. 2 is an example flowchart of an erase procedure showing a series of threshold voltage distributions of memory cells during an erase procedure featuring complete pre-program.

At 20, two distinct threshold voltage distributions are shown. The memory cells represented by the two distinct threshold voltage distributions can represent, in combination, the threshold voltage distribution of memory cells in an erase group. The dotted line threshold voltage distribution represents memory cells in the group which begin the erase procedure with a low threshold voltage erased state. The solid line threshold voltage distribution represents memory cells in the group which begin the erase procedure with a high threshold voltage programmed state.

At 22, the group of memory cells undergoes full pre-program. In full pre-program, every memory cell in the dotted line low threshold voltage distribution is programmed. At 24, two overlapping threshold voltage distributions are shown, which in combination, represent the threshold voltage distribution of memory cells in the erase group. The dotted line threshold voltage distribution, which represents memory cells in the group that began the erase procedure with a low threshold voltage erased state, is programmed. The solid line threshold voltage distribution, which represents memory cells in the group that began the erase procedure with a high threshold voltage programmed state, is unchanged. As a result, both the dotted line and solid line threshold voltage distributions are high threshold voltage distributions.

At 26, the group of memory cells undergoes the erase step. A result of the erase step is a widening of the threshold voltage distribution. At 28, two overlapping threshold voltage distributions are shown, which in combination, represent the threshold voltage distribution of memory cells in the erase group. At the conclusion of pre-program at 24, both the dotted line and solid line threshold voltage distributions had high threshold voltage distributions. Following erase, at 28 both the dotted line and solid line threshold voltage distributions have low threshold voltage distributions.

At 30, the group of memory cells undergoes soft program. The effect of soft program on the over-erased and low threshold voltages cells, is to tighten threshold voltage distribution of the group of memory cells. At 32, two overlapping threshold voltage distributions are shown, which in combination, represent the threshold voltage distribution of memory cells in the erase group. At the conclusion of erase at 28, both the dotted line and solid line threshold voltage distributions had undesirably wide, low threshold voltage distributions. Following soft program, at 32 both the dotted line and solid line threshold voltage distributions have narrow, low threshold voltage distributions.

The erase procedure of as shown in 20-32 has an acceptable threshold voltage distribution of memory cells in the erase group. However, the erase procedure is time consuming, because of the full pre-program at step 22, in which every memory cell in the low threshold voltage distribution is programmed to a high threshold voltage distribution.

Figure 3:
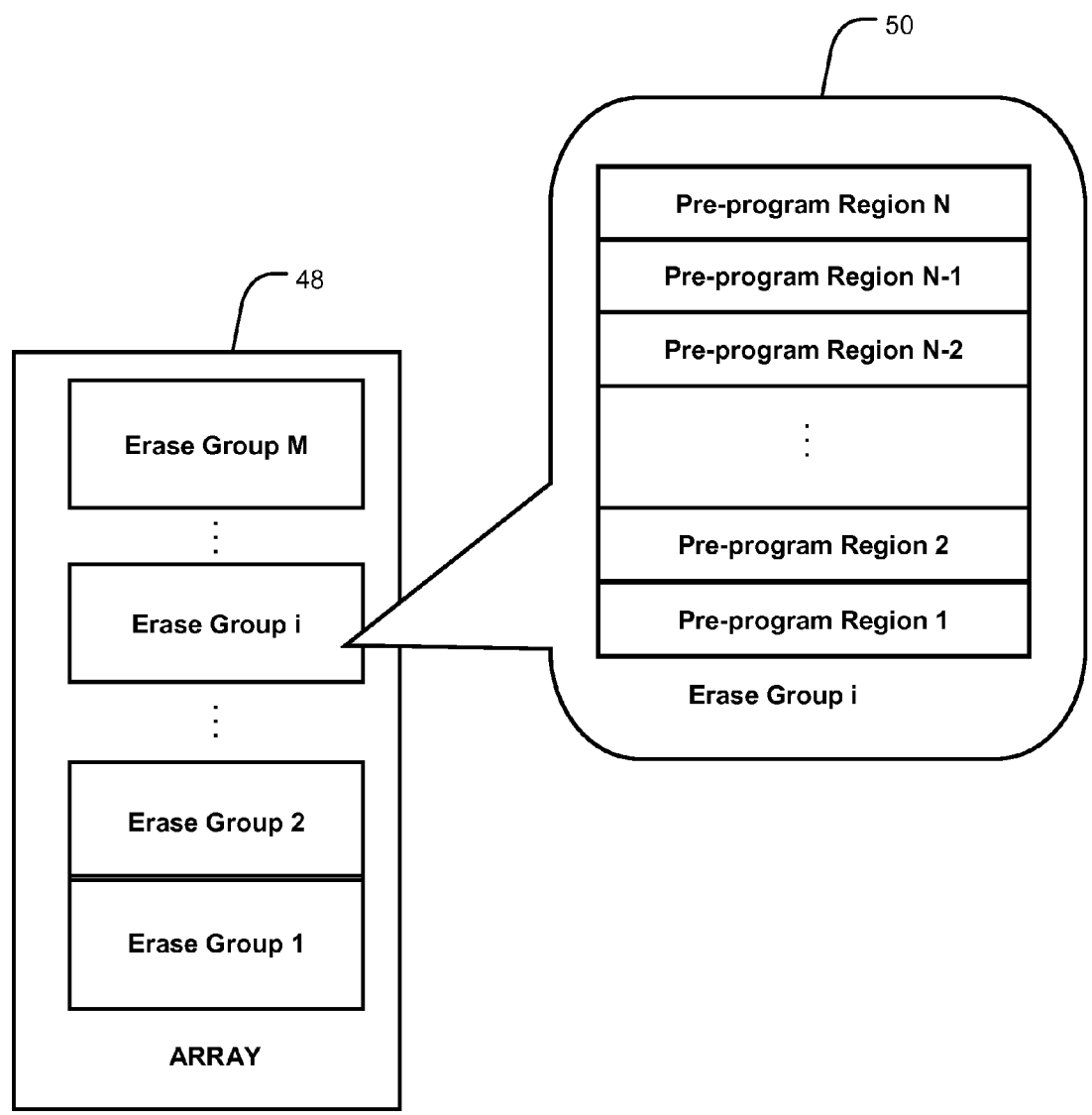
FIG. 3 is a block diagram of a memory cell, showing the division of a memory array into multiple erase groups, and the division of an erase group into multiple pre-program regions.

FIG. 3 is a block diagram of a memory cell, showing the division of a memory array into multiple erase groups, and the division of an erase group into multiple pre-program regions.

The memory array 48 is divided into multiple erase groups 1, 2, . . . , i, . . . , M. An erase group can be a contiguous group of memory cells such as a segment, block, or sector, that are collectively erased together in response to an erase command. The erase group of memory cells can be the whole memory array, in response to an erase command to erase the whole memory array.

The erase groups are further divided into multiple pre-program regions. Erase group i (shown in expanded view 50) is divided into pre-program regions 1, 2, . . . , N-2, N-1, N. With the division of an erase group into multiple pre-program groups, pre-program can be performed on part of an erase group instead of the entire erase group. Over multiple erase procedures, a different pre-program region is selected for pre-program during each subsequent erase procedure, such that each pre-program region has a chance to be pre-programmed.

Figure 4:
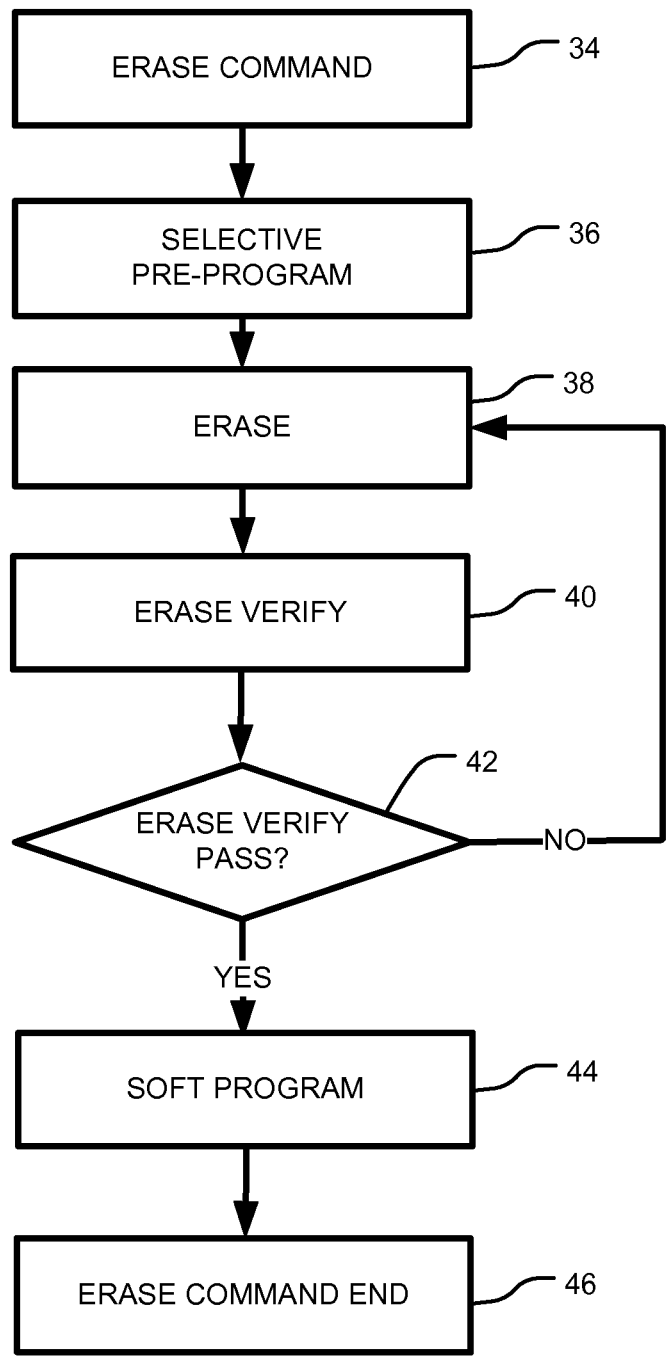
FIG. 4 is an example flowchart of an erase procedure with selective pre-programming on memory cells in the erased state in a particular pre-program region, such as in FIG. 3.

FIG. 4 is an example flowchart of an erase procedure, or erase cycle, with selective pre-programming on memory cells in the erased state in a particular pre-program region, such as in FIG. 3.

At 34, the erase command is received by the integrated circuit with the memory array. The erase command identifies an erase group of memory cells to be erased. An erase group can be a contiguous group of memory cells such as a segment, block, or sector, that are collectively erased together in response to an erase command. The erase group of memory cells can be the whole memory array.

At 36, selective pre-program is performed on the erase group of memory cells identified to be erased. The pre-program is selective in that the pre-program is performed on only part of the erase group of memory cells. As shown in FIG. 3, the erase group is divided into multiple pre-program regions. The pre-program is performed on only memory cells in at least one particular pre-program region. Such selective pre-program is different from a full pre-program, in which all memory cells in the erase group which are already in the erased state are pre-programmed. In selective pre-program, memory cells which are already in the erased state must be in a particular pre-program region of the erase group, in order to undergo pre-program. Even if the erase group has memory cells in the erased state that are outside of the particular pre-program region of the erase group, such memory cells do not undergo pre-program.

Because pre-programming is performed on only part of the erase group of memory cells, pre-programming is faster than if performed on the entire erase group of memory cells.

At 38, erase is performed on all of the memory cells in the erase group of memory cells. At 40, erase verify is performed to check whether the preceding erase step sufficiently erased the memory cells in the group of memory cells selected for erase. At 42, if erase verify fails, then the erase algorithm returns to step 38 to repeat erase. At 42, if erase verify passes, then the erase algorithm proceeds. At 44, soft program is performed on over-erased low threshold voltage cells in the memory group selected for erase, which. At 46, the erase command ends.

In the erase procedure of FIG. 4, at 36 pre-program is not performed on memory cells already in the erased state, in the erase group of memory cells identified to be erased. Over multiple erase procedures, if the same memory cells were repeatedly erased without pre-program, then the memory cells would have unacceptably low threshold voltage. However, this problem is prevented by changing the pre-programmed memory cells, as discussed in connection with FIG. 5.

Figure 5:
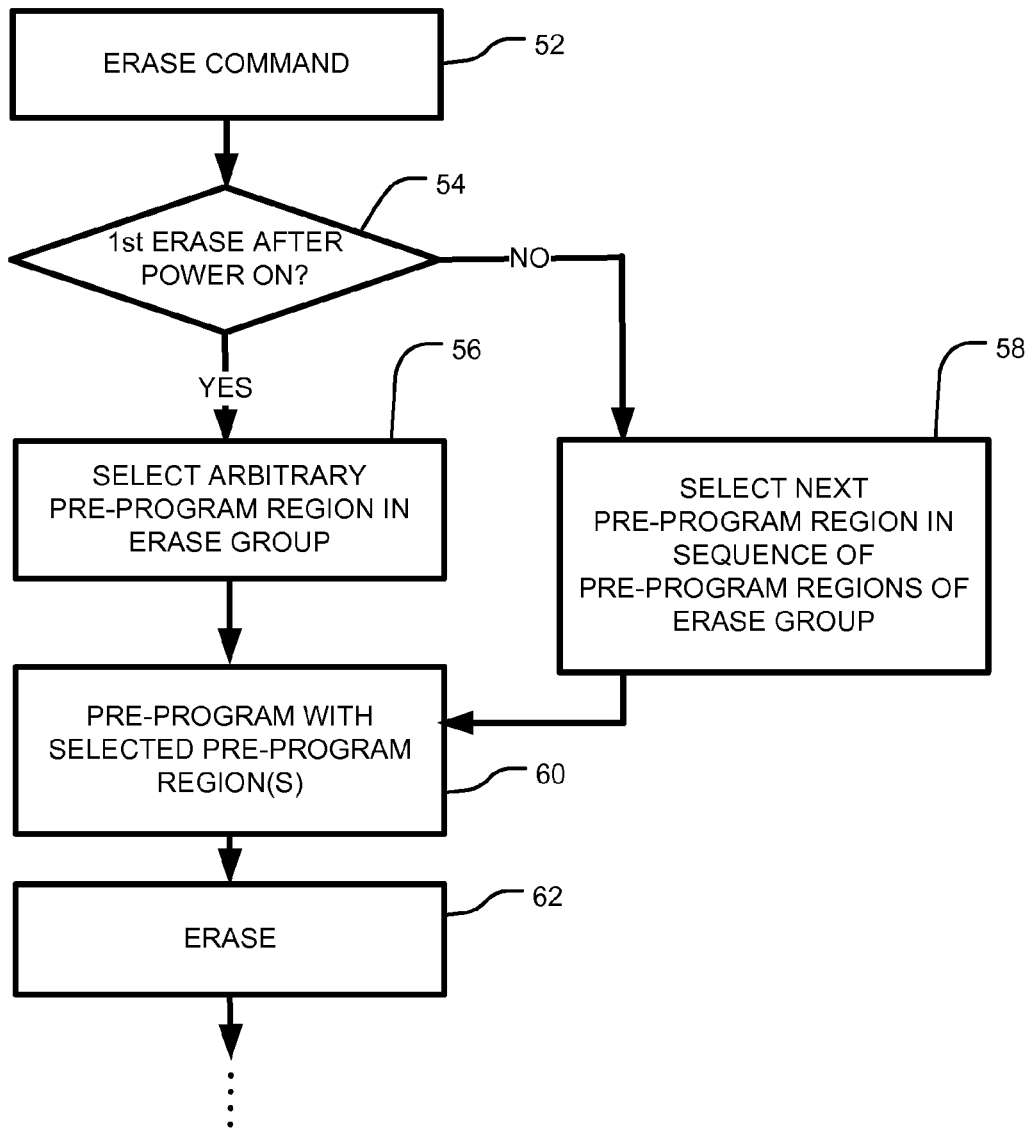
FIG. 5 is an example flowchart of part of an erase procedure with selection of the particular pre-program region that is pre-programmed.

FIG. 5 is an example flowchart of part of an erase procedure with selection of the particular pre-program region that is pre-programmed.

At 52, the erase command is received by the integrated circuit with the memory array. The erase command identifies an erase group of memory cells to be erased.

Step 54 determines whether the erase procedure is the first erase procedure performed after power on. In various embodiments, the erase procedure is the first performed on the entire array, or on the particular erase group which is identified to be erased by the erase command.

If the erase procedure is the first erase procedure performed after power on, then at 56 a pre-program region is randomly, or arbitrarily, selected out of the erase group. In another embodiment, during power on, the first pre-program region is determined. If the erase procedure is the second or subsequent erase procedure performed after power on, then at 58 the next pre-program region is selected out of the pre-program regions of the erase group.

At 60, pre-program is performed on the selected pre-program region. At 62, erase is performed on the entire erase group of memory cells. The ellipsis indicates other steps being performed on memory cells after erase, such as erase verify and soft program as discussed in connection with FIG. 4

Figure 6:
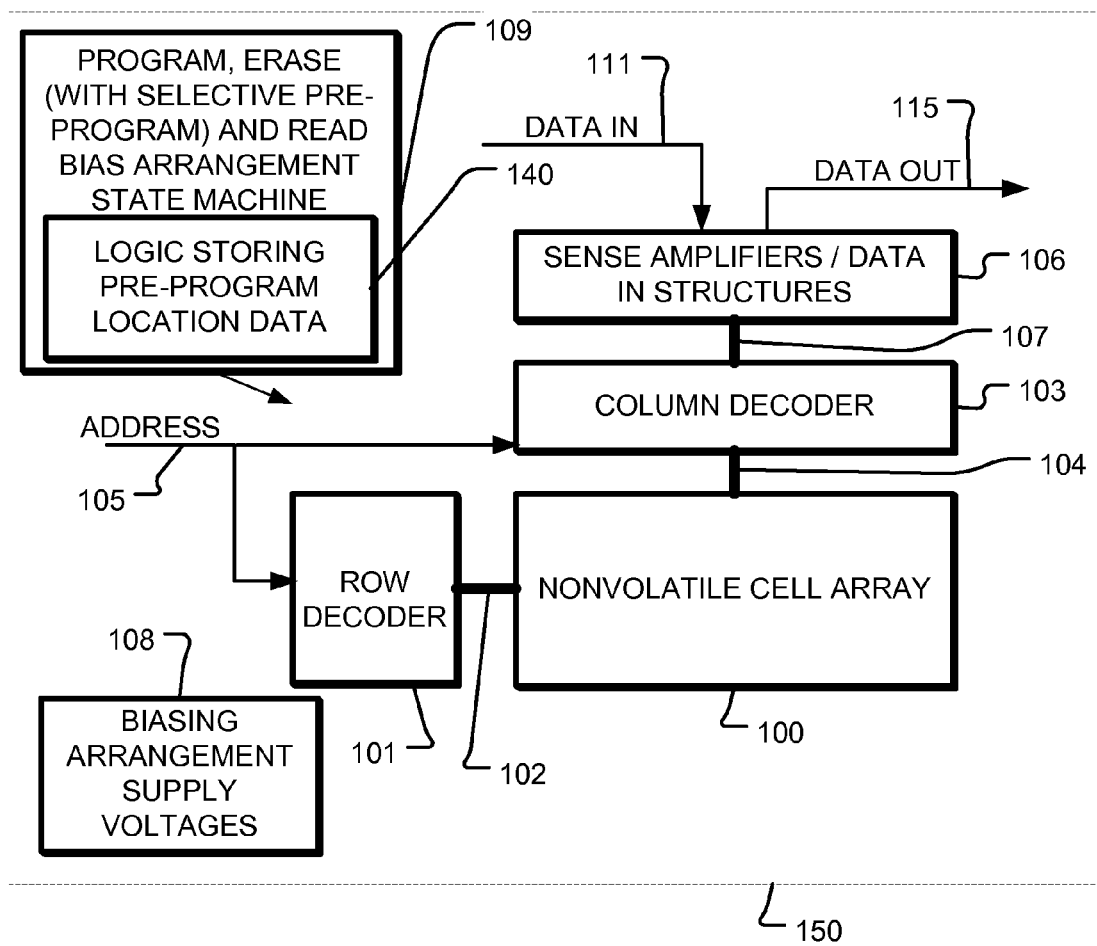
FIG. 6 is a block diagram of an integrated circuit with a memory array and improvements described herein.

FIG. 6 is a block diagram of an integrated circuit with a memory array and improvements described herein. An integrated circuit 150 includes a memory array 100. A word line (or row) and block select decoder 101 is coupled to, and in electrical communication with, a plurality of word lines 102, and arranged along rows in the memory array 100. A bit line (column) decoder and drivers 103 are coupled to and in electrical communication with a plurality of bit lines 104 arranged along columns in the memory array 100 for reading data from, and writing data to, the memory cells in the memory array 100. Addresses are supplied on bus 105 to the word line decoder and drivers 101 and to the bit line decoder 103. Sense amplifiers and data-in structures in block 106, are coupled to the bit line decoder 103 via the bus 107. Data is supplied via the data-in line 111 from input/output ports on the integrated circuit 150, to the data-in structures in block 106. Data is supplied via the data-out line 115 from the sense amplifiers in block 106 to input/output ports on the integrated circuit 150, or to other data destinations internal or external to the integrated circuit 150. Program, erase, and read bias arrangement state machine circuitry 109 controls biasing arrangement supply voltages 108, and performs selective pre-program during erase. State machine circuitry 109 also includes memory 140 that determines a next pre-program region of an erase group that is pre-programmed. Memory 140 can be a nonvolatile memory, counter, or register in control circuitry.

Figure 7:
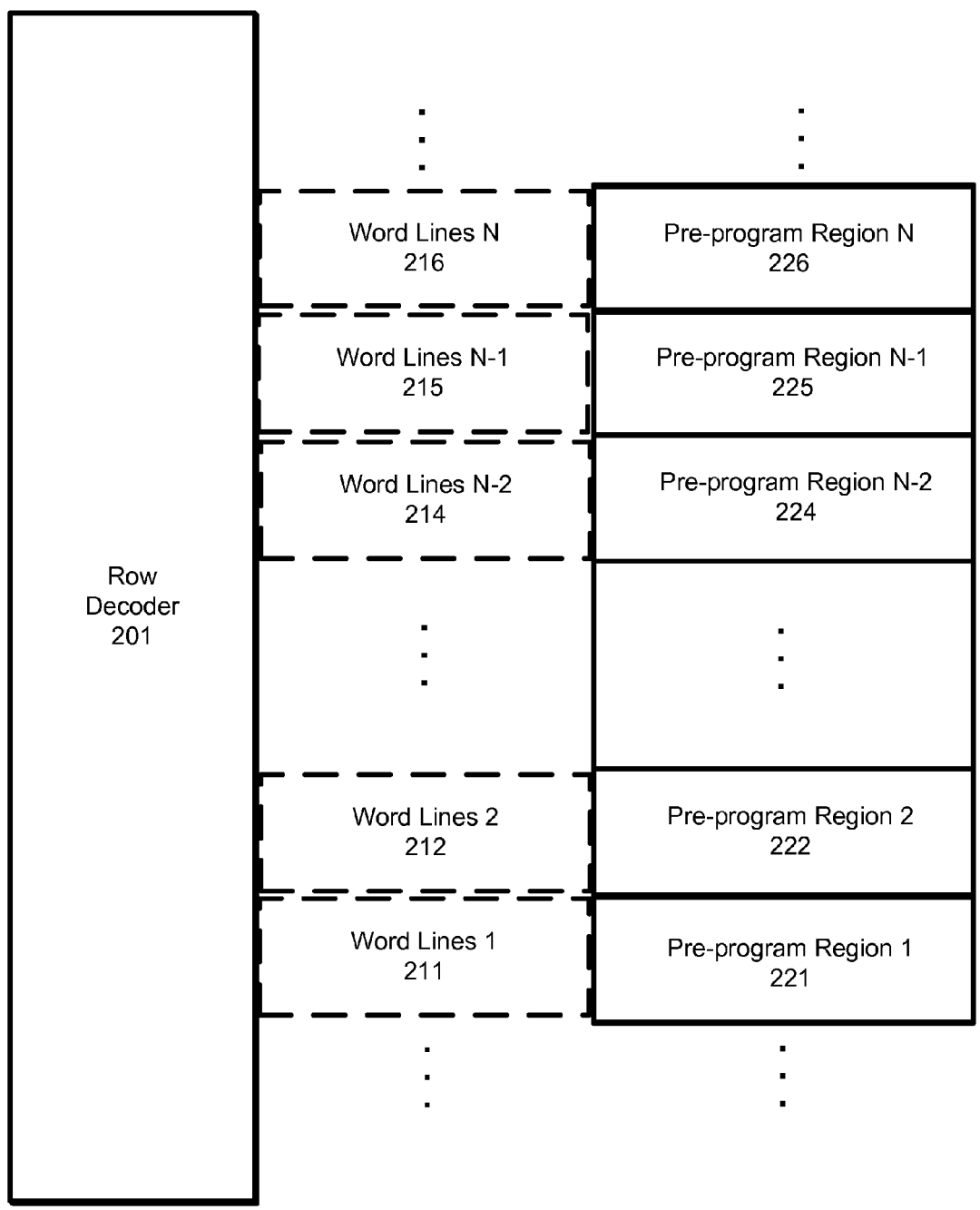
FIG. 7 is a block diagram of sets of word lines allocated to the pre-program regions of an erase group.

FIG. 7 is a block diagram of sets of word lines allocated to the pre-program regions of an erase group.

In particular, a row decoder 201 is coupled to different pre-program regions via different sets of word lines. Word lines 1 211 couple the row decoder 201 to pre-program region 1 221. Word lines 2 212 couple the row decoder 201 to pre-program region 2 222. Word lines N-2 214 couple the row decoder 201 to pre-program region N-2 224. Word lines N-1 215 couple the row decoder 201 to pre-program region N-1 225. Word lines N 216 couple the row decoder 201 to pre-program region N 226.

The different sets of word lines 211, 212, 214, 215, and 216 contain one or more word lines. The shown pre-program regions 221, 222, 224, 225, and 226 belong to a same erase group, such as shown in FIG. 3. Additional erase groups with additional pre-program regions are coupled to the row decoder 201 via additional sets of word lines that are allocated to the additional pre-program regions of the additional erase groups.

Figure 8:
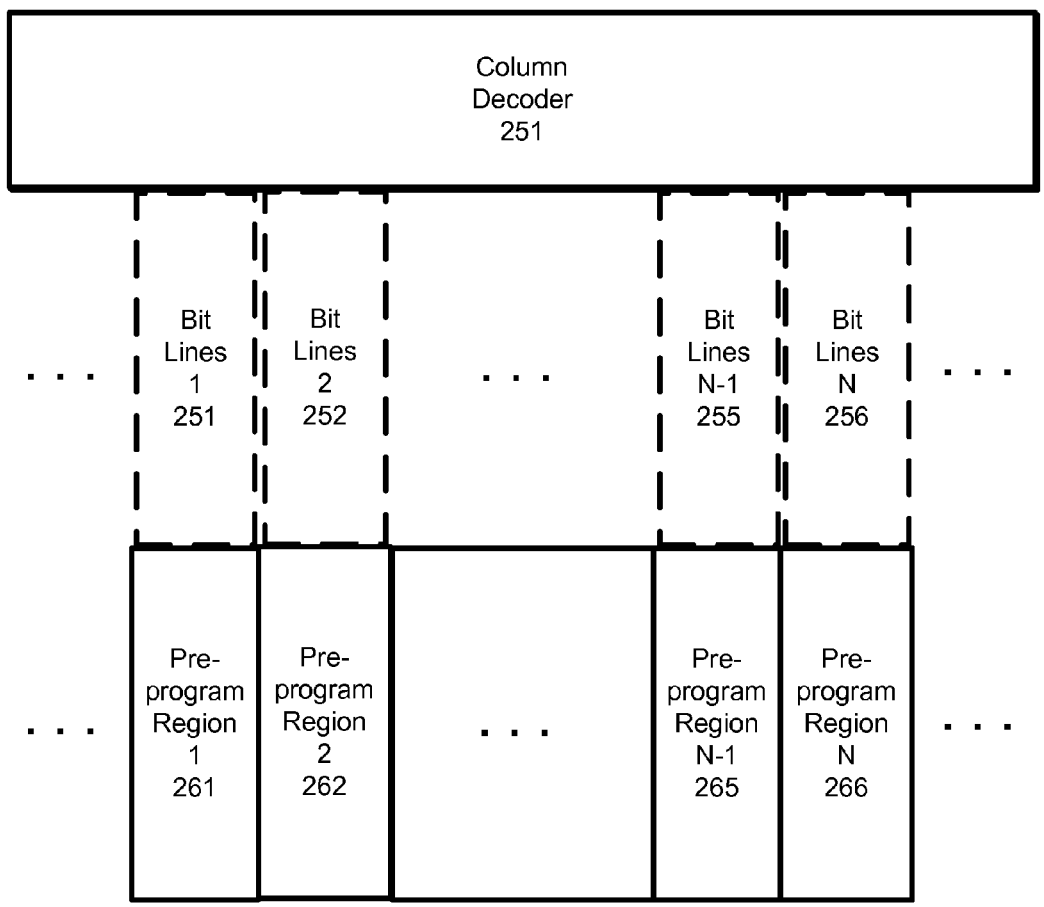
FIG. 8 is a block diagram of sets of bit lines allocated to the pre-program regions of an erase group.

FIG. 8 is a block diagram of sets of bit lines allocated to the pre-program regions of an erase group.

In particular, a column decoder 251 is coupled to different pre-program regions via different sets of bit lines. Bit lines 1 251 couple the column decoder 251 to pre-program region 1 261. Bit lines 2 252 couple the column decoder 251 to pre-program region 2 262. Bit lines N-1 255 couple the column decoder 251 to pre-program region N-1 265. Bit lines N 256 couple the column decoder 251 to pre-program region N 266.

The different sets of bit lines 251, 252, 255, and 256 contain one or more bit lines. The shown pre-program regions 261, 262, 265, and 266 belong to a same erase group, such as shown in FIG. 3. The same erase group can include memory cells on a single word line, or multiple word lines. Multiple pre-program regions can include memory cells on a single word line, or multiple word lines. Additional erase groups with additional pre-program regions are coupled to the column decoder 251 via additional sets of bit lines that are allocated to the additional pre-program regions of the additional erase groups.

One programmed state is shown, but other embodiments cover multiple programmed states, such as multi-level cells with 2 bits and 3 levels of programming per memory location, triple level cell cells with 3 bits or 7 levels of programming per memory location.

The disclosed technology is applicable to nonvolatile memory arrays such as a NOR array. Example nonvolatile memory elements are floating gate elements and dielectric charge trapping memory elements.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a nonvolatile memory array with memory cells characterized by one of a plurality of threshold voltage ranges including at least an erased threshold voltage range and a programmed threshold voltage range; and
control circuitry responsive to an erase command to erase a group of memory cells of the nonvolatile memory array, with a plurality of phases including at least:
a pre-program phase that programs a first set of memory cells in the group having threshold voltages within the erased threshold voltage range, and that does not program a second set of memory cells in the group having threshold voltages within the erased threshold voltage range in the group,
wherein the group is divided into a plurality of pre-program regions, and the first set of memory cells programmed in the pre-program phase is limited to a pre-program region of the plurality of pre-program regions, the integrated circuit further comprises a memory storing pre-program location data, and the control circuitry reads the pre-program location data to determine the pre-program region.

2. The integrated circuit of claim 1,
wherein the pre-program region is selected from the plurality of pre-program regions.

3. The integrated circuit of claim 1,
wherein the pre-program region is selected from the plurality of pre-program regions a first time the control circuitry is responsive to the erase command to erase the group after the integrated circuit is turned on.

4. The integrated circuit of claim 1,
wherein the control circuitry changes the pre-program region to a next pre-program region each time the control circuitry is responsive to the erase command to erase the group.

5. The integrated circuit of claim 1,
wherein a first time the control circuitry is responsive to the erase command to erase the group after the integrated circuit is turned on, the pre-program region is selected from the plurality of pre-program regions, and
wherein second and later times the control circuitry is responsive to the erase command to erase the group after the integrated circuit is turned on, the control circuitry changes the pre-program region to a next pre-program region.

6. The integrated circuit of claim 1, wherein
the nonvolatile memory array is divided into a plurality of erase groups, and the erase command selects the group of memory cells to erase from the plurality of erase groups.

7. The integrated circuit of claim 1, wherein
the pre-program phase does not program a second set of memory cells in the group having threshold voltages within the programmed threshold voltage range in the group.

8. A method of erasing memory cells in an erase cycle, the memory cells arranged in a nonvolatile memory array having a plurality of word lines, the method of the erase cycle comprising:
responsive to an erase command to erase a group of memory cells, performing a pre-program phase that programs only part of a set of memory cells each in an erase state,
wherein the part of the set of memory cells programmed in the pre-program phase is limited to a pre-program region of a plurality of pre-program regions dividing the group, the method further comprising:
reading pre-program location data stored in a memory to determine the pre-program region.

9. The method of claim 8, wherein the set of memory cells is allocated a plurality of word lines, and the part of the set of memory cells is allocated a part of the plurality of word lines.

10. The method of claim 8, wherein the method is responsive to an erase command to erase a group of the memory cells of the memory array, and data in the memory cells are characterized by one of a plurality of threshold voltage ranges including at least an erased threshold voltage range of the erased state and a programmed threshold voltage range of a programmed state.

11. The method of claim 8, further comprising:
selecting the pre-program region from the plurality of pre-program regions.

12. The method of claim 8, further comprising:
a first time the erase command is received after an integrated circuit with the nonvolatile memory array is turned on, selecting the pre-program region from the plurality of pre-program regions.

13. The method of claim 8, further comprising:
each time the erase command is received, changing the pre-program region to a next pre-program region.

14. The method of claim 8, further comprising:
a first time the erase command is received after an integrated circuit with the nonvolatile memory array is turned on, selecting the pre-program region from the plurality of pre-program regions, and
a second and later times the erase command is received after the integrated circuit with the nonvolatile memory array is turned on, changing the pre-program region to a next pre-program region.

15. The method of claim 8, wherein
the pre-program phase does not program a second set of memory cells in the group having threshold voltages within a programmed threshold voltage range in the group.

16. An integrated circuit, comprising:
a nonvolatile memory array with memory cells each having a threshold voltage in one of an erased state and a programmed state; and
control circuitry that, in a plurality of phases responsive to an erase command, erases a group of memory cells of the nonvolatile memory array, the plurality of phases including at least:
a pre-program phase that programs only part of the memory cells in the erased state,
wherein the group is divided into a plurality of pre-program regions, and the only part of memory cells programmed in the pre-program phase is limited to a pre-program region of the plurality of pre-program regions, the integrated circuit further comprises a memory storing pre-program location data, and the control circuitry reads the pre-program location data to determine the pre-program region.

* * * * *